(12) United States Patent
Kelloniemi

(10) Patent No.: US 9,197,958 B2
(45) Date of Patent: Nov. 24, 2015

(54) METHOD AND APPARATUS FOR DEFINING AUDIO SIGNALS FOR HEADPHONES

(71) Applicant: Nokia Technologies Oy, Espoo (FI)

(72) Inventor: Antti Kelloniemi, Espoo (FI)

(73) Assignee: Nokia Technologies Oy, Espoo (FI)

( * ) Notice: Subject to any disclaimer, the term of this patent is extended or adjusted under 35 U.S.C. 154(b) by 91 days.

(21) Appl. No.: 14/132,442

(22) Filed: Dec. 18, 2013

(65) Prior Publication Data

US 2015/0172803 A1 Jun. 18, 2015

(51) Int. Cl.
*H04R 1/10* (2006.01)
*H04R 3/00* (2006.01)
*H03G 3/00* (2006.01)

(52) U.S. Cl.
CPC .............. *H04R 1/1041* (2013.01); *H03G 3/00* (2013.01); *H04R 3/00* (2013.01)

(58) Field of Classification Search
CPC ............................... H04R 5/033; H04R 1/1041
USPC .......................................................... 381/74
See application file for complete search history.

(56) References Cited

U.S. PATENT DOCUMENTS

| 2009/0083045 A1 | 3/2009 | Briand et al. |
| 2009/0164905 A1 | 6/2009 | Ko |
| 2010/0069114 A1* | 3/2010 | Lee et al. .................. 455/556.1 |
| 2013/0003981 A1 | 1/2013 | Lane |
| 2013/0070930 A1 | 3/2013 | Johnson |

FOREIGN PATENT DOCUMENTS

EP 2 120 433 A1 11/2009

OTHER PUBLICATIONS

What Exactly is Beats Audio? Update: An Answer | tunlab™ [online] [retrieved Jul. 16, 2013]. Retrieved from the Internet: <URL: http://tunelab.com/2012/01/09/what-exactly-is-beats-audio-update-an-answer/>. (dated Jan. 9, 2012) 16 pages.
AES Convention Papers Forum >> Design of a Headphone Equalizer Control Based on Principle Component Analysis [online] [retrieved Jul. 16, 2013]. Retrieved from the Internet: <URL: https://secure.aes.org/forum/pubs/conventions/?elib=16770>. (dated May 2013) 1 page.

* cited by examiner

*Primary Examiner* — Simon King
(74) *Attorney, Agent, or Firm* — Alston & Bird LLP

(57) ABSTRACT

A method, apparatus and computer program product are provided to facilitate the listener's configuration of a filter for audio signals to be output by a headphone. In the context of a method, an indication of a size of a headphone is received, such as an indication of a large size including circum-aural and supra-aural headphones or an indication of a small size including intra-concha and in-ear headphones. The method also includes receiving an indication of a gain for a respective frequency band, such as an indication of a balance between high and low frequencies. The method also determines, with a processor, a filter dependent upon the size of the headphone and the gain for the respective frequency band. The method also filters audio signals utilizing the determined filter.

20 Claims, 10 Drawing Sheets

METHOD AND APPARATUS FOR DEFINING AUDIO SIGNALS FOR HEADPHONES

TECHNOLOGICAL FIELD

An example embodiment relates generally to a method and apparatus for defining a filter for audio signals and, more particularly, to a method, apparatus and computer program product for defining a filter for audio signals for a headphone.

BACKGROUND

Many people wear headphones in order to listen to a wide variety of audio, such as music, the soundtrack of a video, audio programs, e.g., podcasts, books on tape or the like. Headphones permit people to listen to audio signals in a manner that does not disturb other people and that maintains the privacy of the listener. Additionally, headphones facilitate mobility, thereby further allowing people to listen to audio signals while walking, running or performing a wide variety of other activities.

The audio quality provided by headphones may vary widely between different pairs of headphones. For example, headphones may apply gain to the different frequency bands of the audio signals in such a manner that the resulting audio signals are of lower quality than is desired. In an effort to increase the quality of the audio signals that is delivered to a listener, a multi-band equalizer could be utilized in conjunction with the headphones such that the listener could individually adjust the gain to be applied to the audio signals in each of a plurality of different frequency bands. However, a multi-band equalizer requires a listener to be relatively sophisticated with respect to audio signal tuning if the quality of the audio signals is to be meaningfully improved. In addition, a listener may have to reconfigure the gain provided by a multi-band equalizer for each of the plurality of frequency bands in instances in which the listener is going to listen to different types of audio signals or different genres of music. Indeed, equalization that depends upon the gain to be separately set for two or more distinct frequency bands, such as bass and treble, may prove challenging for a listener and may result in the listener failing to reconfigure the gain even as the type of audio signals changes, thereby resulting in lower audio quality.

Alternatively, a pair of headphones may include a simple adjustment, such as bass boost, to provide a limited modification of the audio signals. However, such a simple modification, such as bass boost, may not provide a meaningful improvement to the resulting audio signals.

The audio response of different types of headphones may be equalized using two full-band filters with the parameters of the two full-band filters being defined by principal component analysis of a set of frequency responses measured from several headphones of different sizes, such as from several small and large sized headphones, namely, by the first and second principal components. However, it may be difficult for listeners to determine the optimal point at which to set the principal components in order to provide for appropriate full-band filtering since the values of the first and second principal components are not intuitive.

BRIEF SUMMARY

A method, apparatus and computer program product are provided in accordance with an example embodiment in order to facilitate the listener's configuration of a filter for audio signals to be output by a headphone. In this regard, the method, apparatus and computer program product may take into account the size of the headphone in defining the filter, thereby simplifying the configuration of the filter, while providing for the audio signals to be filtered in a manner that provides greater audio quality. As such, the method, apparatus and computer program product of an example embodiment may improve the user experience associated with listening to audio signals on a headphone.

In an example embodiment, a method is provided for receiving an indication of a size of a headphone, such as an indication of a large size including circum-aural and supra-aural headphones or an indication of a small size including intra-concha and in-ear headphones. The method of this example embodiment also includes receiving an indication of a gain for a respective frequency band, such as an indication of a balance between high and low frequencies. The method of this example embodiment also determines, with a processor, a filter dependent upon the size of the headphone and the gain for the respective frequency band. The method of this example embodiment also filters audio signals utilizing the determined filter.

The method of an example embodiment may determine the filter by modifying the shape of the filter based upon the size of the headphone. In this regard, the method may modify the shape of the filter by modifying corner frequencies of the filter based upon the size of the headphone. In an embodiment in which the indication of the gain for a respective frequency band includes an indication of a balance between high and low frequencies, the method may determine the filter by modifying the balance between high and low frequencies provided by the filter. The method of an example embodiment may determine the filter based on at least a difference between first and second principal components over a range of frequencies and a sum of the first and second principal components over the range of frequencies. In this regard, the difference and the sum are associated with the size of the headphone. The method of an example embodiment may also include causing a first query to be presented regarding the size of the headphone and causing a second query to be presented regarding the balance between high and low frequencies.

In another example embodiment, an apparatus is provided that includes at least one processor and at least one memory communicatively coupled to the at least one processor with the at least one memory including computer program code for determining a filter for audio signals. The computer program code, when executed by the at least one processor, is configured to cause the apparatus of an example embodiment to at least receive an indication of a size of a headphone, such as by receiving an indication of a large size including circum-aural and supra-aural headphones or an indication of a small size including intra-concha or in-ear headphones. The computer program code, when executed by the at least one processor, may also be configured to cause the apparatus of an example embodiment to receive an indication of a gain for a respective frequency band, such as an indication of a balance between high and low frequencies. The computer program code, when executed by the at least one processor, may also be configured to cause the apparatus of an example embodiment to determine a filter dependent upon the size of the headphone and the gain for the respective frequency band. The computer program code, when executed by the at least one processor, may also be configured to cause the apparatus of an example embodiment to filter audio signals utilizing the determined filter.

The computer program code, when executed by the at least one processor, may be configured to cause the apparatus of an example embodiment to determine the filter by modifying the shape of the filter based upon the size of the headphone. In this regard, the computer program code, when executed by the at least one processor, may be configured to cause the apparatus to modify the shape of the filter by modifying corner frequencies of the filter based upon the size of the pair of headphones. The computer program code, when executed by the at least one processor, may also be configured to cause the apparatus of an example embodiment to determine the filter by modifying the balance between high and low frequencies provided by the filter in an instance in which the indication of the gain for a respective frequency band includes an indication of the balance between high and low frequencies.

The computer program code, when executed by the at least one processor, may be configured to cause the apparatus of an example embodiment to determine the filter based on at least a difference between first and second principal components of a range of frequencies and a sum of the first and second principal components over the range of frequencies. Additionally, the difference and the sum are associated with the size of the headphone. The computer program code, when executed by the at least one processor, is further configured to cause the apparatus of an example embodiment to cause a first query to be presented regarding the size of the headphone and to cause a second query to be presented regarding the gain for the respective frequency band.

In a further example embodiment, a computer program code is provided that includes at least one non-transitory computer-readable storage medium having computer-executable program code portions stored therein with the computer-executable program code portions including program code instructions for receiving an indication of a size of a headphone. For example, the indication of the size of the headphone may include an indication of a large size including circum-aural and supra-aural headphones or an indication of a small size including intra-concha or in-ear headphones. The computer-executable program code portions may also include program code instructions for receiving an indication of the gain for a respective frequency band, such as an indication of a balance between high and low frequencies. The computer-executable program code portions may also include program code instructions for determining a filter dependent upon the size of the headphone and the gain for the respective frequency band and for filtering audio signals utilizing the determined filter.

The program code instructions for determining the filter may include program code instructions for modifying a shape of the filter based upon the size of the headphone. In this regard, the program code instructions for modifying the shape of the filter may include program code instructions for modifying corner frequencies of the filter based upon the size of the headphone. The program code instructions for determining the filter may also include program code instructions for modifying the balance between high and low frequencies provided by the filter in an instance in which the indication of the gain for the respective frequency band includes an indication of a balance between high and low frequencies. The computer-executable program code portions of an example embodiment may also include program code instructions for causing a first query to be presented regarding the size of the headphone and program code instructions for causing a second query to be presented regarding the balance between high and low frequencies.

In yet another example embodiment, an apparatus is provided that includes means for receiving an indication of the size of a headphone and means for receiving an indication for the gain for a respective frequency band, such as an indication of a balance between high and low frequencies. The apparatus of this example embodiment also includes means for determining a filter dependent upon the size of the headphone and the gain for the respective frequency band. The apparatus of this example embodiment further includes means for filtering audio signals utilizing the determined filter.

BRIEF DESCRIPTION OF THE DRAWINGS

Figure 1:
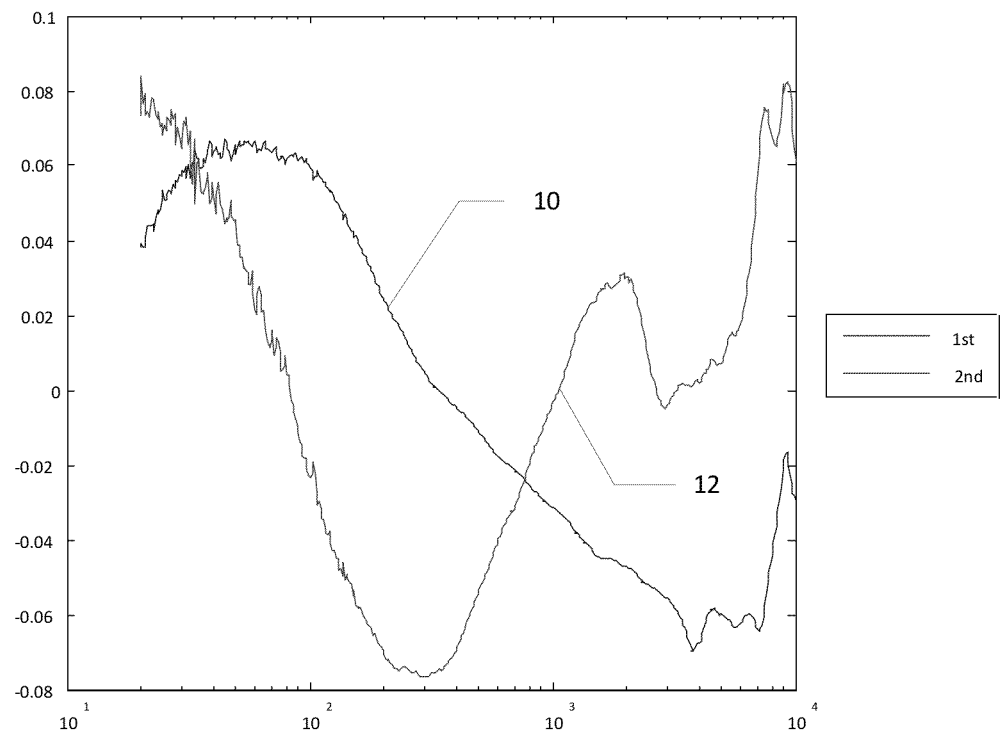
Figure 2A:
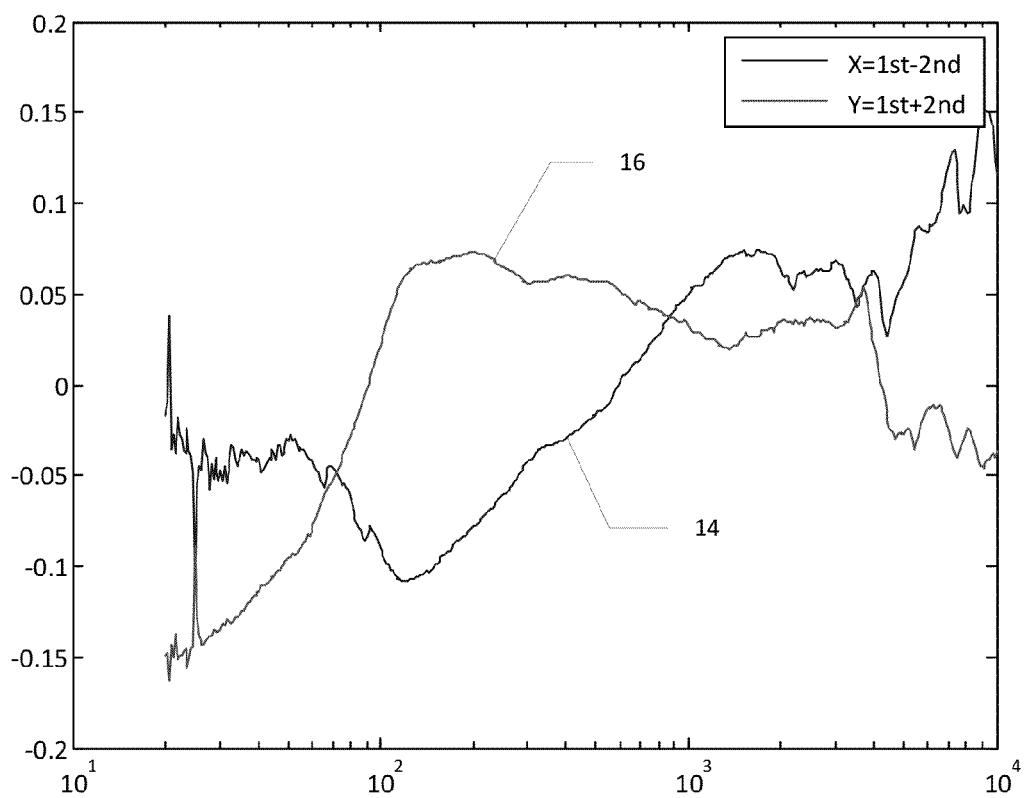
Figure 2B:
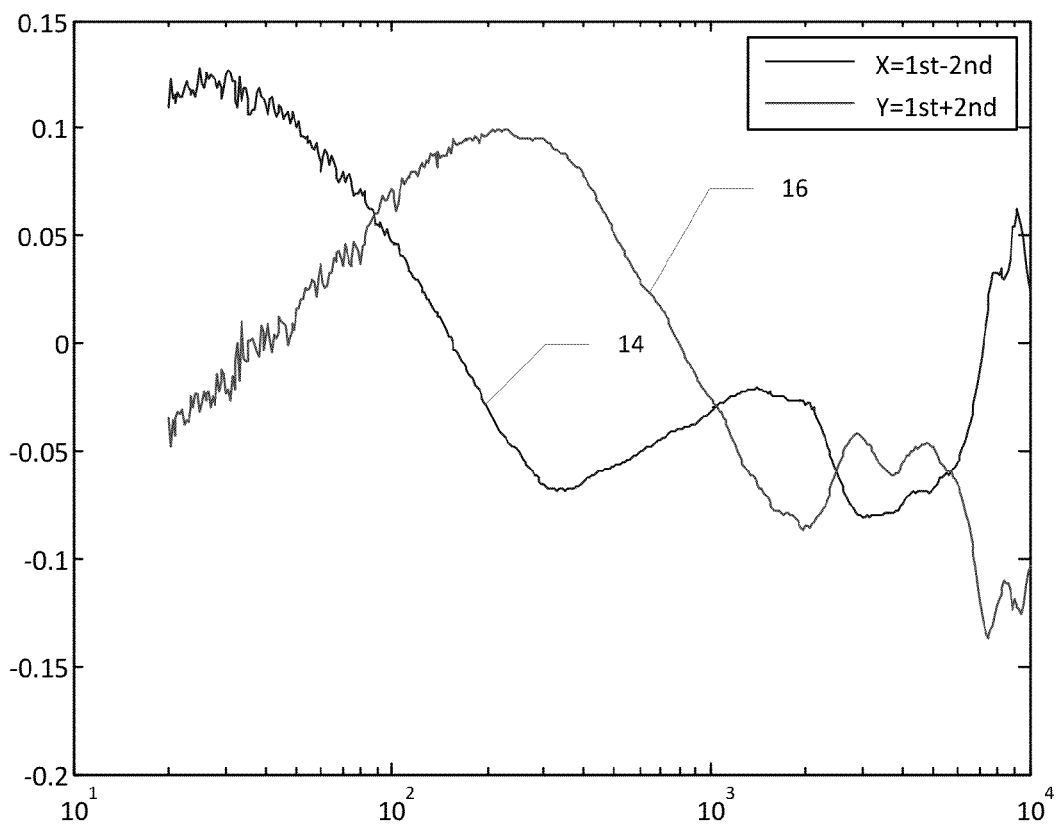
Figure 3A:
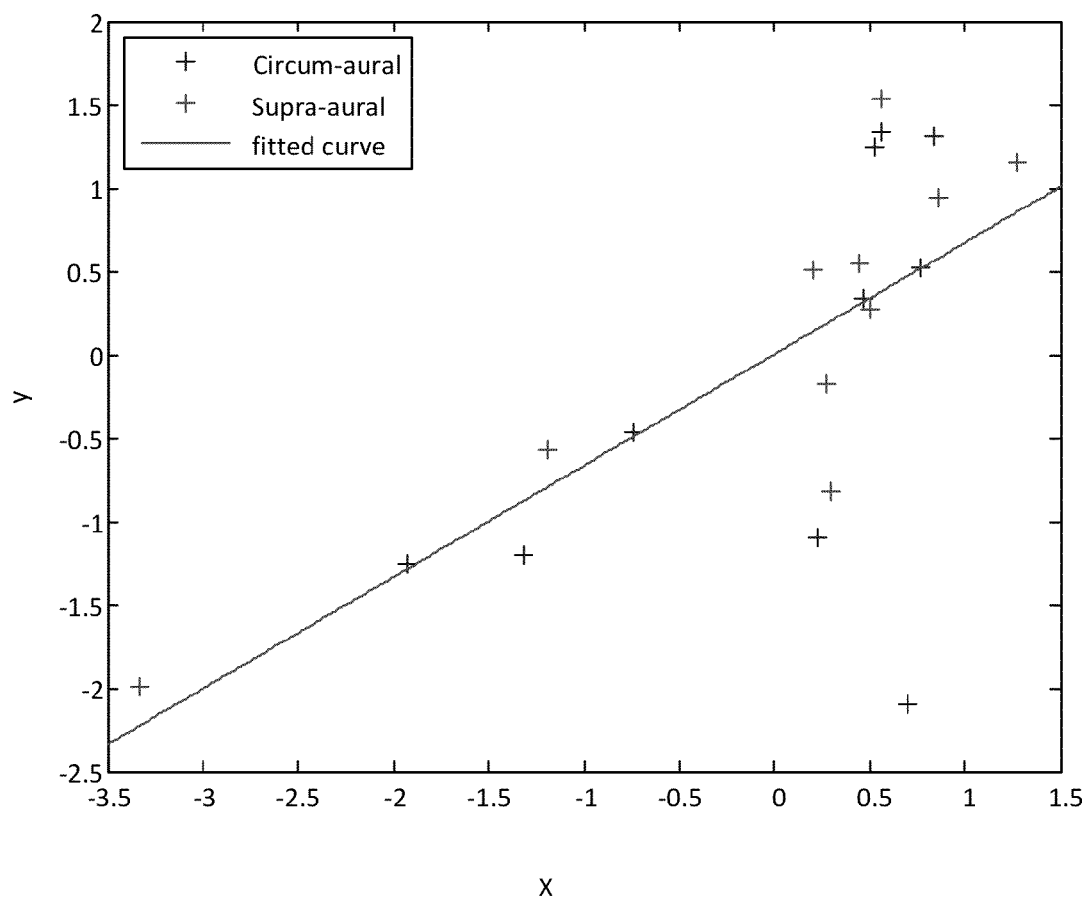
Figure 3B:
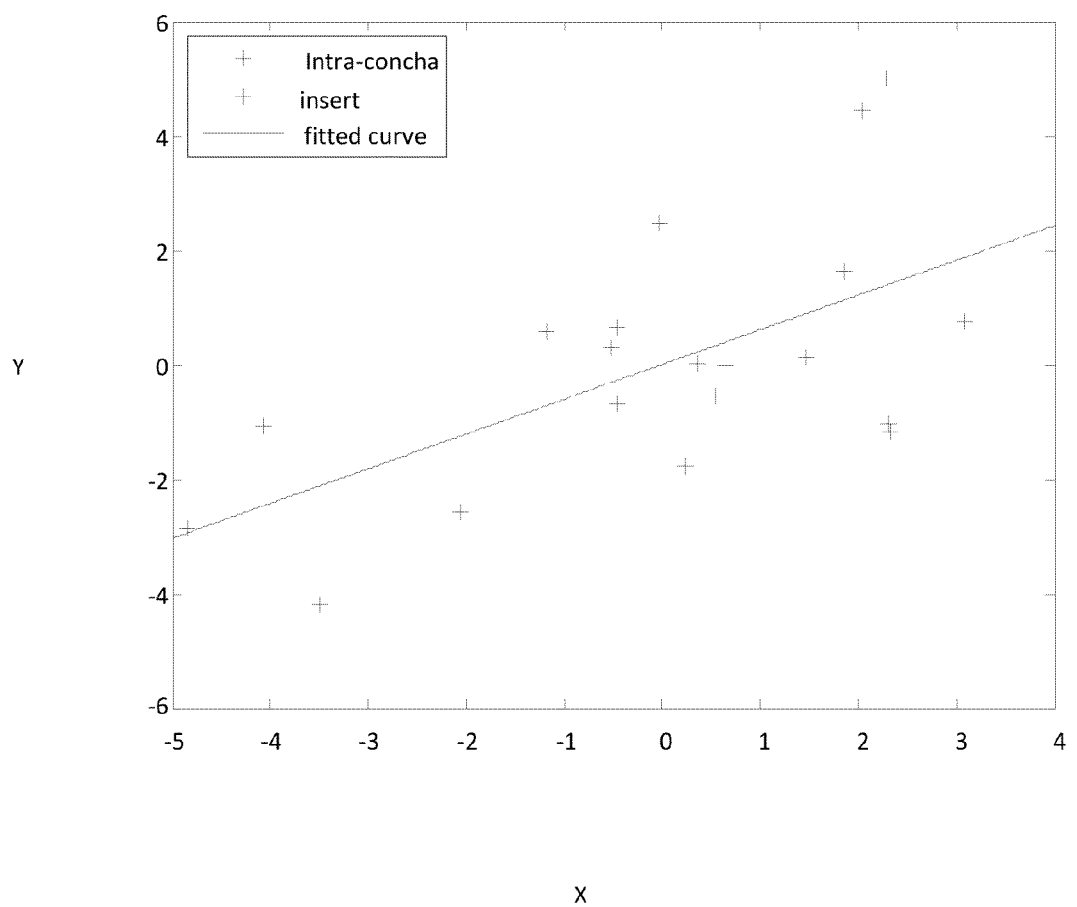
Figure 4:
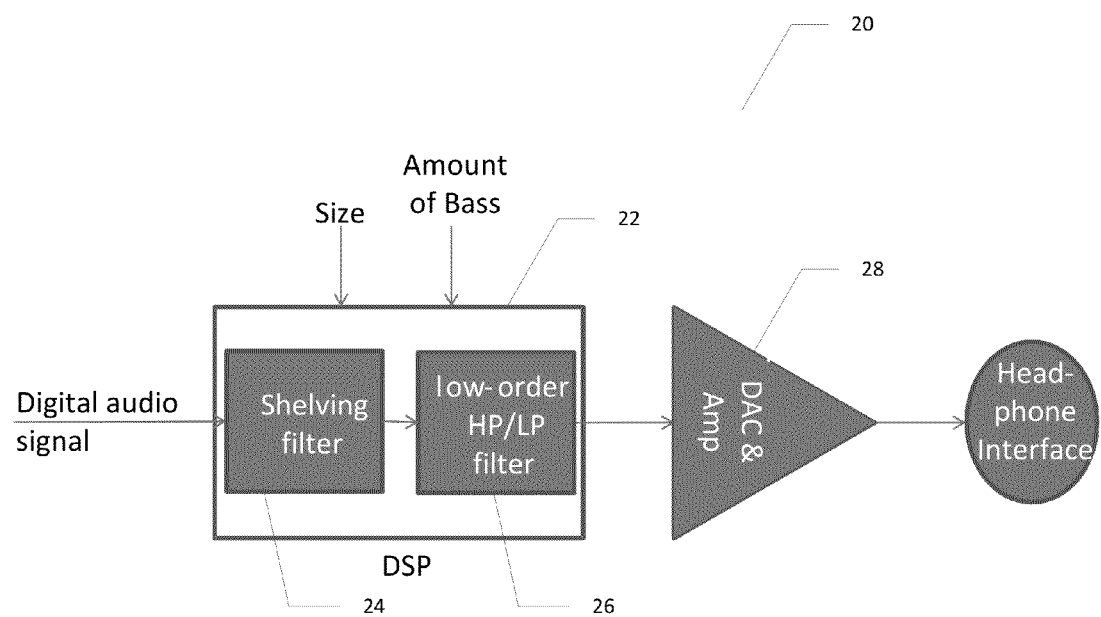
Figure 5:
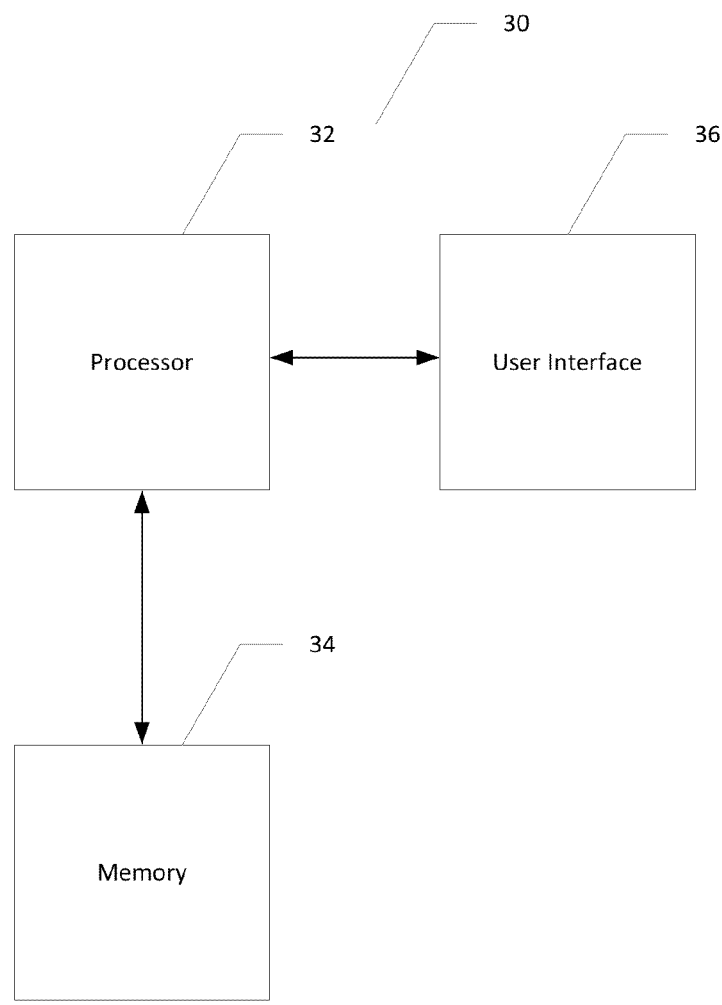
Figure 6:
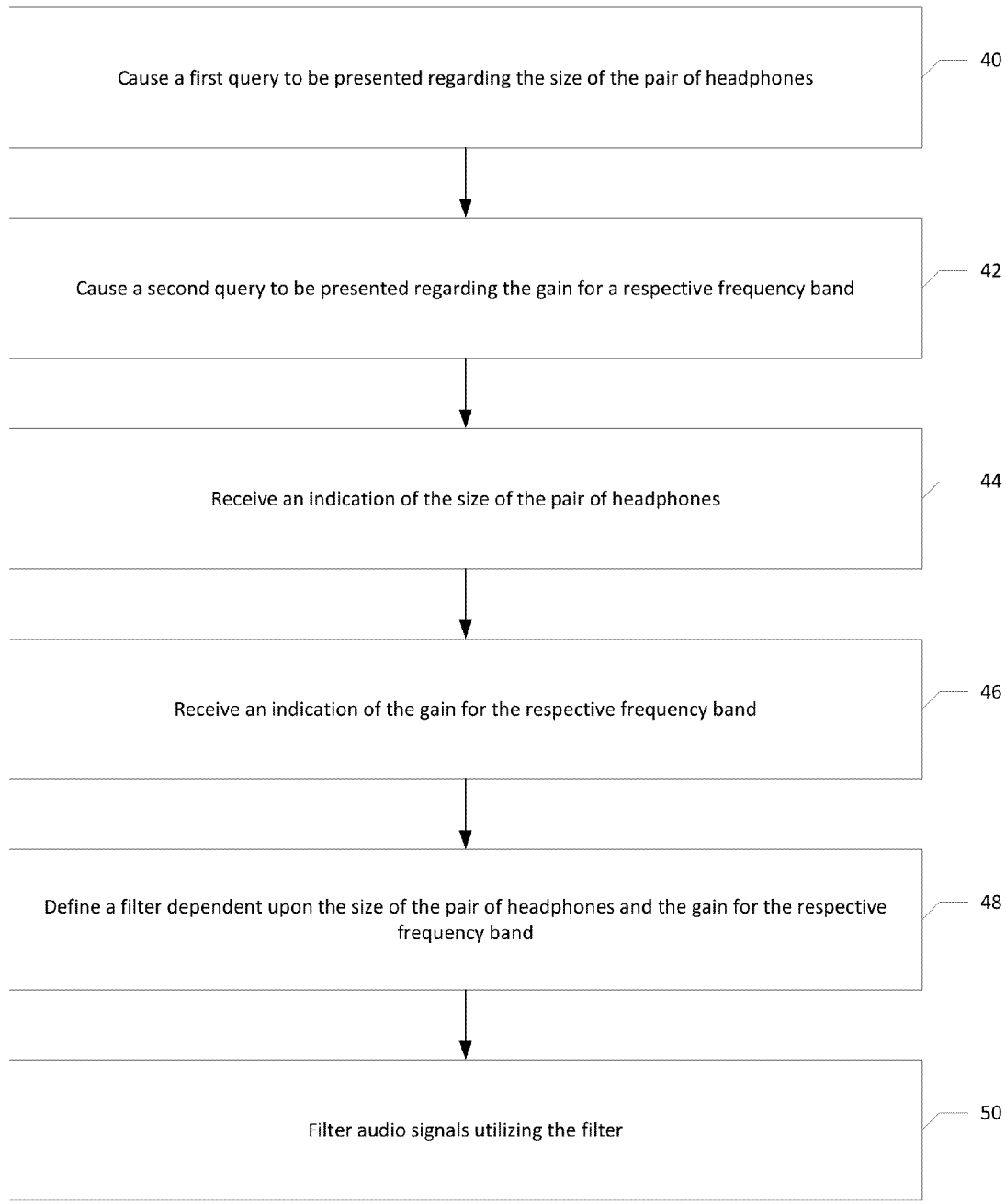
Figure 7:
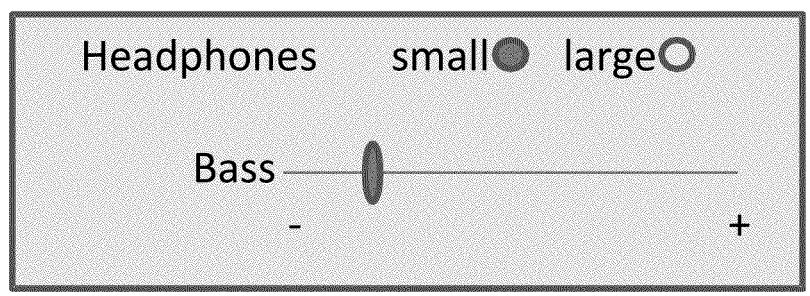
Figure 8:
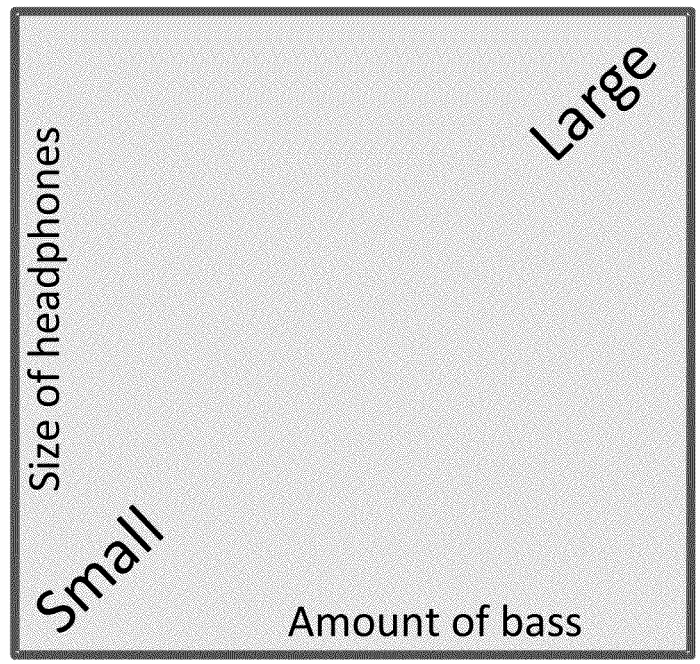

Having thus described certain example embodiments of the present invention in general terms, reference will now be made to the accompanying drawings, which are not necessarily drawn to scale, and wherein:

FIG. 1 is a graphical representation of the first and second principal components of a set of frequency responses of several headphones of multiple sizes and shapes;

FIGS. 2A and 2B are graphical representations of X and Y indicative of a difference and a sum of the two principal components over a range of frequencies for headphones having large and small sizes, respectively;

FIGS. 3A and 3B are graphical representations of a fitted curve defining a relationship between X and Y of FIGS. 2A and 2B, respectively, for headphones have large and small sizes, respectively;

FIG. 4 is a block diagram of a filter in accordance with an example embodiment of the present invention;

FIG. 5 is a block diagram of an apparatus, such as may be embodied by a digital signal processor of the filter of FIG. 4, that may be specifically configured in accordance with an example embodiment of the present invention;

FIG. 6 is a flowchart illustrating operations performed, such as by the apparatus of FIG. 5, in accordance with an example embodiment of the present invention;

FIG. 7 is a user interface that may be presented in accordance with an example embodiment of the present invention in order to receive user input regarding the size of a pair of headphones and the balance between high and low frequencies, such as the amount of bass; and FIG. 8 is a user interface that may be presented in accordance with another example embodiment of the present invention in order to receive user input regarding the size of a pair of headphones and the balance between high and low frequencies, such as the amount of bass.

DETAILED DESCRIPTION

Some embodiments of the present invention will now be described more fully hereinafter with reference to the accompanying drawings, in which some, but not all, embodiments of the invention are shown. Indeed, various embodiments of the invention may be embodied in many different forms and should not be construed as limited to the embodiments set forth herein; rather, these embodiments are provided so that this disclosure will satisfy applicable legal requirements. Like reference numerals refer to like elements throughout. As used herein, the terms "data," "content," "information," and similar terms may be used interchangeably to refer to data capable of being transmitted, received and/or stored in accordance with embodiments of the present invention. Thus, use of any such terms should not be taken to limit the spirit and scope of embodiments of the present invention.

Additionally, as used herein, the term 'circuitry' refers to (a) hardware-only circuit implementations (e.g., implementations in analog circuitry and/or digital circuitry); (b) combinations of circuits and computer program product(s) comprising software and/or firmware instructions stored on one or more computer readable memories that work together to cause an apparatus to perform one or more functions described herein; and (c) circuits, such as, for example, a microprocessor(s) or a portion of a microprocessor(s), that require software or firmware for operation even if the software or firmware is not physically present. This definition of 'circuitry' applies to all uses of this term herein, including in any claims. As a further example, as used herein, the term 'circuitry' also includes an implementation comprising one or more processors and/or portion(s) thereof and accompanying software and/or firmware. As another example, the term 'circuitry' as used herein also includes, for example, a baseband integrated circuit or applications processor integrated circuit for a mobile phone or a similar integrated circuit in a server, a cellular network device, other network device, and/or other computing device.

As defined herein, a "computer-readable storage medium," which refers to a non-transitory physical storage medium (e.g., volatile or non-volatile memory device), can be differentiated from a "computer-readable transmission medium," which refers to an electromagnetic signal.

Referring now to FIG. 1, a graphical representation of the values (y-axis) of the first 10 and second 12 principal components of the audio signals output by a pair of headphones over a range of frequencies (x-axis) is depicted. The first and second principal components are determined via principal component analysis of a set of frequency responses measured from several headphones of different sizes, such as from several small and large sized headphones, and may effectively describe or characterize the audio signals including the various frequency components of the audio signals. In this regard, principal component analysis employs orthogonal transformation to convert a set of possibly correlated values to a set of values of linearly uncorrelated variables termed principal components. The first principal component has the largest variance with each succeeding component having the largest possible variance while being orthogonal to, that is, uncorrelated with, the preceding components. As used herein, principal component analysis and the resulting principal components will relate to the principal component analysis of a set of frequency responses measured from several headphones of different sizes, such as from several small and large sized headphones.

The headphones that were analyzed to determine the first and second principal components of the audio signals output included a wide variety of headphones including large headphones, such as circum-aural and supra-aural headphones, and small headphones, such as intra-concha and in-ear headphones. Although a composite representation of the first and second principal components of a variety of headphones including both large and small headphones is depicted in FIG. 1, the first and second principal components that describe the audio response for large headphones differ materially from the first and second principal components of the audio response of a pair of small headphones.

The difference between the audio responses of a large set of large headphones and small headphones, as represented by the first and second principal components, are depicted in FIGS. 2A and 2B, respectively. In this regard, a difference X between the first principal component and a second principal component of a pair of headphones at each of a plurality of different frequencies across a range of frequencies may be defined as shown by line 14. Similarly, a sum of the first principal component and the second principal component of a pair of headphones at each of a plurality of frequencies across the range of frequencies may be defined as shown by line 16. FIGS. 2A and 2B, therefore, graphically represent the value (y-axis) of the difference X and the sum Y of the first and second principal components of the audio response of a pair of large headphones and a pair of small headphones, respectively, across a range of frequencies (x-axis).

The relationship between the first and second principal components of the audio responses of a large set of large headphones and small headphones may also be graphically represented as shown in FIGS. 3A and 3B, respectively. In this regard, the difference X between the first and second principal components of the audio response of a pair of headphones is plotted along the x-axis relative to the sum Y of the first and second principal components of the audio response of the pair of headphones along the y-axis at each of a plurality of different frequencies. In this regard, FIGS. 3A and 3B illustrate the line that best fits the plurality of data points so as to define a linear relationship between the difference and the sum of the first and second principal components of a pair of large headphones and a pair of small headphones, respectively. As shown, both the position and the slope of the line defining the best fit linear relationship between X and Y differs between the pair of large headphones in FIG. 3A and the pair of small headphones in FIG. 3B.

As noted above, the first and second principal components calculated from the audio responses of several pairs of headphones may be combined to a difference X and a sum Y. Since the difference X and the sum Y have a linear correlation as shown, for example, in FIGS. 3A and 3B, the difference X and the sum Y of the first and second principal components may be combined into a single parameter G that may be defined as $G=X+bY$ so as to define or characterize the audio response of a pair of headphones. As such, the filter may be determined based at least on the difference X and the sum Y with the difference and the sum being associated with the size of the headphones. As illustrated by FIGS. 2A, 2B, 3A and 3B, the parameters X, Y and b will have different values for the audio response of a pair of large headphones as opposed to the audio response of a pair of small headphones.

Referring now to FIG. 4, a filter 20 in accordance with an example embodiment of the present invention is depicted. The filter may be embodied by or otherwise associated with a headphone. As illustrated and described herein by way of example but not of limitation, the headphone may be a pair of headphones, such as stereo headphones. However, the headphone may alternatively be a mono headphone. As shown, the filter is configured to receive digital audio signals, such as music, the soundtrack of a video, an audio program or the like. The filter may include a digital signal processor 22 for receiving the digital audio signals and for appropriately filtering the digital audio signals. The filter may also include a digital to analog converter (DAC) and an amplifier 28 for receiving the filtered audio signals from the digital signal processor and for providing appropriately conditioned audio signals to the pair of headphones for output to a listener. Although the digital signal processor may be configured in various manners, the digital signal processor of the illustrated embodiment includes a shelving filter 24 and a high pass (HP)/low pass (LP) filter 26, such as a low-order high pass/low pass filter. In the digital signal domain, the shelving filter may be implemented as an all-pass filter stage and the high pass/low pass filter may be implemented as a finite impulse response filter, for example.

In an example embodiment, the digital signal processor 22 including, for example, the shelving filter 24 and the high pass/low pass filter 26, may be embodied by an apparatus 30 as shown in FIG. 5. The apparatus is specifically configured to perform the operations to determine a filter for a pair of headphones. As shown in FIG. 5, for example, the apparatus may include or otherwise be in communication with a processor 32, a memory device 34 and a user interface 36. In some embodiments, the processor (and/or co-processors or any other processing circuitry assisting or otherwise associated with the processor) may be in communication with the memory device via a bus for passing information among components of the apparatus. The memory device may be non-transitory and may include, for example, one or more volatile and/or non-volatile memories. In other words, for example, the memory device may be an electronic storage device (e.g., a computer readable storage medium) comprising gates configured to store data (e.g., bits) that may be retrievable by a machine (e.g., a computing device like the processor). The memory device may be configured to store information, data, content, applications, instructions, or the like for enabling the apparatus to carry out various functions in accordance with an example embodiment of the present invention. For example, the memory device could be configured to buffer input data for processing by the processor. Additionally or alternatively, the memory device could be configured to store instructions for execution by the processor.

As noted above, the apparatus 30 may be embodied by a digital signal processor 22 and, in turn, by a filter embodied by or associated with a pair of headphones. However, in some embodiments, the apparatus may be embodied as a chip or chip set. In other words, the apparatus may comprise one or more physical packages (e.g., chips) including materials, components and/or wires on a structural assembly (e.g., a baseboard). The structural assembly may provide physical strength, conservation of size, and/or limitation of electrical interaction for component circuitry included thereon. The apparatus may therefore, in some cases, be configured to implement an embodiment of the present invention on a single chip or as a single "system on a chip." As such, in some cases, a chip or chipset may constitute means for performing one or more operations for providing the functionalities described herein.

The processor 32 may be embodied in a number of different ways. For example, the processor may be embodied as one or more of various hardware processing means such as a coprocessor, a microprocessor, a controller, a digital signal processor (DSP), a processing element with or without an accompanying DSP, or various other processing circuitry including integrated circuits such as, for example, an ASIC (application specific integrated circuit), an FPGA (field programmable gate array), a microcontroller unit (MCU), a hardware accelerator, a special-purpose computer chip, or the like. As such, in some embodiments, the processor may include one or more processing cores configured to perform independently. A multi-core processor may enable multiprocessing within a single physical package. Additionally or alternatively, the processor may include one or more processors configured in tandem via the bus to enable independent execution of instructions, pipelining and/or multithreading.

In an example embodiment, the processor 32 may be configured to execute instructions stored in the memory device 34 or otherwise accessible to the processor. Alternatively or additionally, the processor may be configured to execute hard coded functionality. As such, whether configured by hardware or software methods, or by a combination thereof, the processor may represent an entity (e.g., physically embodied in circuitry) capable of performing operations according to an embodiment of the present invention while configured accordingly. Thus, for example, when the processor is embodied as an ASIC, FPGA or the like, the processor may be specifically configured hardware for conducting the operations described herein. Alternatively, as another example, when the processor is embodied as an executor of software instructions, the instructions may specifically configure the processor to perform the algorithms and/or operations described herein when the instructions are executed. However, in some cases, the processor may be a processor of a specific device (e.g., a filter for a pair of headphones) configured to employ an embodiment of the present invention by further configuration of the processor by instructions for performing the algorithms and/or operations described herein. The processor may include, among other things, a clock, an arithmetic logic unit (ALU) and logic gates configured to support operation of the processor.

In some embodiments, the apparatus 30 may also optionally include or otherwise be in communication with a user interface 36 that may, in turn, be in communication with the processor 32 to provide output to the user and, in some embodiments, to receive an indication of a user input. As such, the user interface may include a display and, in some embodiments, may also include a keyboard, a mouse, a joystick, a touch screen, touch areas, soft keys, one or more microphones, a plurality of speakers, or other input/output mechanisms. In an example embodiment, the processor may comprise user interface circuitry configured to control at least some functions of one or more user interface elements such as a display and, in some embodiments, a plurality of speakers, a ringer, one or more microphones and/or the like. The processor and/or user interface circuitry comprising the processor may be configured to control one or more functions of one or more user interface elements through computer program instructions (e.g., software and/or firmware) stored on a memory accessible to the processor (e.g., memory device 34, and/or the like).

Regardless of the manner in which the digital signal processor 22 is embodied, the digital signal processor may receive an indication of the size of the headphones, such as an indication that the headphones are large, such as circum-aural or supra-aural headphones, or an indication that the headphones are small, such as an intra-concha or in-ear headphone. Additionally, the digital signal processor may receive an indication of the gain of a respective frequency band. In an example embodiment as described below, the indication of the gain of a respective frequency band is an indication of a balance between high and low frequencies, such as an amount of bass. However, an indication of the gain of another frequency band, such as an indication of the amount of treble or, more generally, the tonal balance, may be provided in alternative embodiments. In an example embodiment, however, an indication of the gain of only a single frequency band is provided such that a listener is not required to provide separate inputs for each of a plurality of frequency bands which may, in turn, engender confusion on behalf of the listener.

As described below, the indications of the size of the headphones and the gain for a respective frequency band, such as the balance between high and low frequencies, may cause the filter provided by the digital signal processor to be modified. For example, the indication of the size of the headphones may cause the shape of the filter to be modified, such as by modifying the corner frequencies of the filter. As another example, the indication of the gain for a respective frequency band, such as an indication of the balance between high and low frequencies, e.g., the amount of bass, may cause the gain parameters of the filter to be modified. As such, the audio response provided by a pair of headphones may be meaningfully improved in response to limited input by the listener.

Referring now to FIG. 6, the operations performed by an apparatus 30 in accordance with an example embodiment of the present invention in order to determine the filter for the audio signals output by a pair of headphones is depicted. As shown in block 44 of FIG. 6, for example, the apparatus may include means, such as the processor 32, the user interface 36 or the like, for receiving an indication of the size of the pair of headphones, such as an indication as to whether the headphones or large, such as such as circum-aural headphones or supra-aural headphones, or small, such as intra-concha headphones or in-ear headphones. As shown in block 46 of FIG. 6, the apparatus may also include means, such as the processor, the user interface or the like, for receiving an indication of the gain for a respective frequency band, such as an indication of the balance between high and low frequencies, e.g., the amount of bass.

The apparatus 30, such as the processor 32, the user interface 36 or the like, may be configured to receive the indications of the size of the pair of headphones and the gain for the respective frequency band in various manners. In an example embodiment, however, the apparatus may include means, such as the processor, the user interface or the like, for causing respective queries to be presented regarding the size of the headphones and the gain for the respective frequency band. See blocks 40 and 42 of FIG. 6. In response to the queries, user input may be received that indicates the size of the pair of headphones and the gain for the respective frequency band. By way of example, FIGS. 7 and 8 illustrate two displays that may be presented by the apparatus, such as the processor, the user interface or the like, in order to solicit input from the user regarding the size of the pair of headphones and the gain of the respective frequency band, such as the balance between high and low frequencies, e.g., the amount of bass. In FIG. 7, the display includes radio buttons to select the size of the headphones and a slider for indicating the gain of the respective frequency band, such as the amount of bass. Alternatively, in FIG. 8, the display solicits user input to select a combination of the size of the headphones and the gain of the respective frequency band, such as the amount of bass.

The apparatus 30 of this example embodiment also includes means, such as the processor 32 or the like, for determining a filter, such as a full-band filter, depending upon the size of the pair of headphones and the gain for the respective frequency band, such as the balance between high and low frequencies, e.g., the amount of bass. See block 48 of FIG. 6. The apparatus may further include means, such as the processor or the like, for filtering the audio signals utilizing the filter. See block 50. As such, the audio signals output by the pair of headphones may be of higher quality and more representative of the desired experience, thereby correspondingly improving the user experience.

The apparatus 30, such as the processor 32, may be configured to determine the filter dependent upon the size of the pair of headphones and the gain for the respective frequency band, such as the balance between high and low frequencies, e.g., the amount of bass, in various manners. In an example embodiment, the size of the pair of headphones may impact the shape of the filter, such as the corner frequencies of the filter. As such, the apparatus, such as the processor, may be configured to determine the filter by modifying the shape of the filter based upon the size of the pair of headphones and, more particularly, by modifying the corner frequencies of the filter based upon the size of the pair of headphones. With larger headphones, for example, the corner frequency of the shelving filter may be lower, such as by at least 100 Hz, than for smaller headphones. Additionally, the corner frequency of the high pass/low pass filter may be set close to, but not below, the corner frequency of the shelving filter so as to also be impacted by the size of the pair of headphones. Together, the shelving filter and the high pass/low pass filter create the desired shape of the frequency response, following the curves defined by $G = X + bY$, as described below.

Additionally, the gain for the respective frequency band, such as the amount of bass or the tonal balance, at least partially defines the gain provided by the filter. Thus, the apparatus 30, such as the processor 32, may be configured to determine the filter by modifying the gain provided by the filter based upon the gain for the respective frequency band, such as the balance between high and low frequencies, e.g., the amount of bass. For example, an indication that the gain for a respective frequency band should be increased will correspondingly cause the filter to be determined in a manner that modifies the gain of the filter by increasing the gain provided by the filter, at least for the respective frequency band, by increasing the gain parameters of the filter. Conversely, receipt of an indication that the gain for a respective frequency band should be reduced will correspondingly cause the filter to be determined in a manner that modifies the gain of the filter by reducing the gain for the respective frequency band by reducing the gain parameters of the filter. As such, the indication received via the user interface has a direct relation to the gains of the high pass/low pass filter and the shelving filter, which have a constant relation to one another. In this regard, the gains of both the high pass/low pass filter and the shelving filter may be adjusted on the basis of the indication received via the user interface. Depending upon the input provided by the user, the gains may have either positive or negative values.

By way of example, in an instance in which the indication of the gain for a respective frequency band is an indication of an amount of bass, an indication of an increased amount of bass may cause the filter to be determined in a manner that the gain for lower frequencies is increased relative to the gain for higher frequencies. Conversely, receipt of an indication of a reduced amount of bass may cause the filter to be determined in a manner that reduces the gain for lower frequencies relative to the gain provided for higher frequencies.

As described above, the audio performance of a filter may be determined in terms of the first and second principal components. These principal components may, in turn, be represented by a difference X and sum Y of the principal components with the difference X and sum Y thereafter being combined as a result of a linear relationship therebetween so as to be represented as $G = X + bY$, which defines the audio performance of the filter. In the foregoing equation, G represents the frequency response of the filter including, for example, a shelving filter and a high pass/low pass filter. Thus, the gain of the filter may be determined in accordance with an example embodiment as $G = X + bY$ over a range of frequencies. The filter may be determined by combining the frequency responses of the principal components with the factor b being defined so that the best fit, that is, the best correlation, may be found between the line and the measured values of X and Y, such as shown in FIGS. 3A and 3B. As described above, the values for X, Y and b vary depending upon the size of the pair of headphones. Thus, receipt of the indication of the size of the pair of headphones may, in turn, define the values of X, Y and b since different sets of values for X, Y and b may be predefined for large headphones and for small headphones.

As such, the size of the headphones and the gain for a respective frequency band, such as the balance between high and low frequencies, e.g., the amount of bass, may cause the filter to be determined such that audio signals may be subsequently filtered and output by the pair of headphones in order to provide audio signals having the desired audio qualities. By only requiring input from the user in regards to the size of the headphones and the gain for a respective frequency band, such as the balance between high and low frequencies, e.g., the amount of bass, the user is able to provide the requisite input in an intuitive manner for parameters that are relatively comprehensible, while the resulting quality of the audio signals is tailored for the size of headphones and the user's desired gain for the respective frequency band of interest. Thus, the quality of the audio signals output by the pair of headphones is enhanced with only minimal input from the listener.

In terms of the balance, it is noted that as a result of the headphone acoustics and the signal processing chain, the sound will have a balance (or unbalance) between high and low frequencies. The user, however, may prefer a different relation between different frequency bands than that otherwise produced by the current combination of the headphone acoustics and the signal processing chain. As such, the method, apparatus and computer program product of an example embodiment permit the user to adjust the relation or balance between the different frequency bands. Typically, however, users prefer the sound to have relatively equal amounts of high and low frequencies, hence a balance between high and low frequencies. By adjustment of the gain, a user may establish the desired balance between the high and low frequencies, whether equal or not. For example, in some embodiments, the user may adjust the gain such that the resulting filter more greatly modifies the gain associated with signals having a low frequency than those signals having a high frequency, for which the gain is not modified or is only modified minimally relative to the modification of the low frequency signals.

A pair of headphones generally has a left channel and a right channel directed to the left and right headphones, respectively. As such, the method, apparatus and computer program product of an example embodiment may determine a filter, including the shape and gain information, for one of the channels and then replicate the same filter for the other channel. Alternatively, the method, apparatus and computer program product of another embodiment may separately determine a filter for each of the left and right channels.

As described above, FIG. 6 illustrates a flowchart of an apparatus 30, method and computer program product according to example embodiments of the invention. It will be understood that each block of the flowchart, and combinations of blocks in the flowchart, may be implemented by various means, such as hardware, firmware, processor, circuitry, and/or other communication devices associated with execution of software including one or more computer program instructions. For example, one or more of the procedures described above may be embodied by computer program instructions. In this regard, the computer program instructions which embody the procedures described above may be stored by a memory device 34 of an apparatus employing an embodiment of the present invention and executed by a processor 32 of the apparatus. As will be appreciated, any such computer program instructions may be loaded onto a computer or other programmable apparatus (e.g., hardware) to produce a machine, such that the resulting computer or other programmable apparatus implements the functions specified in the flowchart blocks. These computer program instructions may also be stored in a computer-readable memory that may direct a computer or other programmable apparatus to function in a particular manner, such that the instructions stored in the computer-readable memory produce an article of manufacture the execution of which implements the function specified in the flowchart blocks. The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowchart blocks.

Accordingly, blocks of the flowchart support combinations of means for performing the specified functions and combinations of operations for performing the specified functions for performing the specified functions. It will also be understood that one or more blocks of the flowchart, and combinations of blocks in the flowchart, can be implemented by special purpose hardware-based computer systems which perform the specified functions, or combinations of special purpose hardware and computer instructions.

In some embodiments, certain ones of the operations above may be modified or further amplified. Furthermore, in some embodiments, additional optional operations may be included. Modifications, additions, or amplifications to the operations above may be performed in any order and in any combination.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Moreover, although the foregoing descriptions and the associated drawings describe example embodiments in the context of certain example combinations of elements and/or functions, it should be appreciated that different combinations of elements and/or functions may be provided by alternative embodiments without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

That which is claimed:

1. A method comprising:
receiving an indication of a size of a headphone;
receiving an indication of a gain for a respective frequency band;
determining, with a processor, a filter dependent upon the size of the headphone and the gain for the respective frequency band; and
filtering audio signals utilizing the determined filter.

2. A method according to claim 1 wherein determining the filter comprises modifying a shape of the filter based upon the size of the headphone.

3. A method according to claim 2 wherein modifying the shape of the filter comprises modifying corner frequencies of the filter based upon the size of the headphone.

4. A method according to claim 1 wherein the indication of the gain for the respective frequency band comprises an indication of a balance between high and low frequencies, and wherein determining the filter comprises modifying the balance between high and low frequencies provided by the filter.

5. A method according to claim 1 further comprising causing a first query to be presented regarding the size of the headphone and causing a second query to be presented regarding the balance between high and low frequencies.

6. A method according to claim 1 wherein the indication of the size of the headphone includes one of an indication of a large size including circum-aural and supra-aural headphones or an indication of a small size including intra-concha and in-ear headphones.

7. A method according to claim 1 wherein determining the filter comprises determining the filter based on at least a difference between first and second principal components over a range of frequencies and a sum of the first and second principal components over the range of frequencies, and wherein the difference and the sum are associated with the size of the headphone.

8. An apparatus comprising:
at least one processor; and
at least one memory communicatively coupled to the at least one processor, wherein the at least one memory includes computer program code for determining a filter for audio signals, the computer program code, when executed by the at least one processor, configured to cause the apparatus to at least:
receive an indication of a size of a headphone;
receive an indication of a gain for a respective frequency band;
determine a filter dependent upon the size of the headphone and the gain for the respective frequency band; and
filter audio signals utilizing the determined filter.

9. An apparatus according to claim 8 wherein the computer program code, when executed by the at least one processor, is configured to cause the apparatus to determine the filter by modifying a shape of the filter based upon the size of the headphone.

10. An apparatus according to claim 9 wherein the computer program code, when executed by the at least one processor, is configured to cause the apparatus to modify the shape of the filter by modifying corner frequencies of the filter based upon the size of the headphone.

11. An apparatus according to claim 8 wherein the indication of the gain for the respective frequency band comprises an indication of a balance between high and low frequencies, and wherein the computer program code, when executed by the at least one processor, is configured to cause the apparatus to determine the filter by modifying the balance between high and low frequencies provided by the filter.

12. An apparatus according to claim 8 wherein the computer program code, when executed by the at least one processor, is further configured to cause the apparatus to cause a first query to be presented regarding the size of the headphone and cause a second query to be presented regarding the balance between high and low frequencies.

13. An apparatus according to claim 8 wherein the indication of the size of the headphone includes one of an indication of a large size including circum-aural and supra-aural headphones or an indication of a small size including intra-concha and in-ear headphones.

14. An apparatus according to claim 8 wherein the computer program code, when executed by the at least one processor, is configured to cause the apparatus to determine the filter based at least on a difference between first and second principal components over a range of frequencies and a sum of the first and second principal components over the range of frequencies, and wherein the difference and the sum are associated with the size of the headphone.

15. A computer program product comprising at least one non-transitory computer-readable storage medium having computer-executable program code portions stored therein, the computer-executable program code portions comprising program code instructions for:
receiving an indication of a size of a headphone;
receiving an indication of a gain for a respective frequency band;
determining a filter dependent upon the size of the headphone and the gain for the respective frequency band; and
filtering audio signals utilizing the determined filter.

16. A computer program product according to claim 15 wherein the program code instructions for determining the filter comprise program code instructions for modifying a shape of the filter based upon the size of the headphone.

17. A computer program product according to claim 16 wherein the program code instructions for modifying the shape of the filter comprise program code instructions for modifying corner frequencies of the filter based upon the size of the headphone.

18. A computer program product according to claim 15 wherein the indication of the gain for the respective frequency band comprises an indication of a balance between high and low frequencies, and wherein the program code instructions for determining the filter comprise program code instructions for modifying the balance between high and low frequencies provided by the filter.

19. A computer program product according to claim 15 wherein the computer-executable program code portions further comprise program code instructions for causing a first query to be presented regarding the size of the headphone and program code instructions for causing a second query to be presented regarding the a balance between high and low frequencies.

20. A computer program product according to claim 15 wherein the indication of the size of the headphone includes one of an indication of a large size including circum-aural and supra-aural headphones or an indication of a small size including intra-concha and in-ear headphones.

* * * * *